LINEAR AMPLIFIER UTILIZING A PAIR OF FIELD EFFECT TRANSISTORS

Filed Dec. 16, 1966

INVENTOR:
ROBERT H. CRAWFORD

E. Mickey Hubbard
ATTORNEY

United States Patent Office 3,436,621

Patented Apr. 1, 1969

3,436,621

LINEAR AMPLIFIER UTILIZING A PAIR OF FIELD EFFECT TRANSISTORS

Robert H. Crawford, Richardson, Tex., assignor to Texas Instruments Incorporated, Dallas, Tex., a corporation of Delaware Filed Dec. 16, 1966, Ser. No. 602,220
Int. Cl. H01l 11/14
U.S. Cl. 317—235 8 Claims

ABSTRACT OF THE DISCLOSURE

This invention relates generally to semiconductor devices, and more particularly relates to an A.C. amplifier having a substantially constant linear response over a relatively wide temperature range that is formed by a pair of field effect transistors.

In many instances it is desirable to obtain a linear output voltage as a function of the input voltage over a wide voltage swing. If a fixed resistor is used as a load for any field effect transistor (FET), however, the output voltage will be a nonlinear function of the input, and more specifically will have a square law relationship to the input. In order to obtain a linear response, it has heretofore been necessary to utilize negative feedback and reduced gain implemented by components external of the field effect amplifier. In addition to having a nonlinear transfer characteristic, a standard FET amplifier using a fixed load resistor results in significant changes in gain with variations in temperature.

An important object of this invention is to provide an A.C. amplifier having a linear transfer function and a constant gain over a substantial temperature range.

Another important object of the invention is to provide such an amplifier which is formed from field effect transistor devices.

Still another important object is to provide such an A.C. amplifier which is simple and may be wholly formed on a single semiconductor substrate.

Yet another object of the invention is to provide such a device having substantial voltage swings over the linear portion of the transfer curve.

These and other objects are accomplished in accordance with the present invention by using a driver field effect transistor to drive a load field effect transistor having substantially the same square law characteristics when operated in the saturation region while operating both of the transistors in the saturation region. The transistors exhibit square law gain characteristics in the saturation region which compensate and produce an inverting amplifier having a linear response. While the invention is applicable generally to all FET devices exhibiting square law characteristics in the saturation region, it is particularly adapted for implementation by metal-oxide-semiconductor (MOS) field effect transistors.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
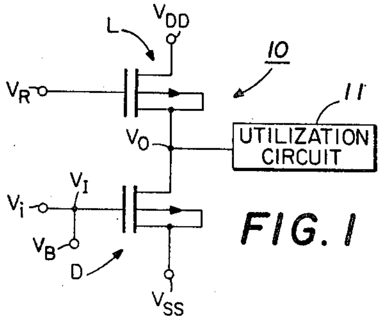
FIGURE 1 is a schematic circuit diagram of an amplifier constructed in accordance with the present invention.

Referring now to the drawings, an A.C. amplifier constructed in accordance with the present invention is indicated generally by the reference numeral 10 in FIGURE 1. The amplifier 10 is comprised of a driver FET, indicated generally by the reference character D, and a load FET, indicated generally by the reference character L. Within the broader aspects of the invention, the FET's may be either n-channel or p-channel and either enhancement or depletion mode devices. However, in all cases both the driver and the load are of the same type and exhibit substantially the same square law characteristics, but do not necessarily have the same transconductance. The drain of the driver D is electrically common with the source of the load L and forms the output $v_O$ of the device which is connected to some utilization circuit 11. The source of the driver D is connected to a source voltage supply $V_{SS}$, the drain of the load L is connected to a drain voltage supply $V_{DD}$, the gate of the load L is connected to a constant reference voltage $V_R$, which is selected such that the load transistor L will always be operated in the saturation region. The gate of the driver D is the input of the amplifier $v_I$ and receives an input voltage signal which is the sum of a D.C. bias level selected such that the driver transistor D will continue to operate in the saturation region as the A.C. input voltage swings. The bias voltage is represented by the input terminal $V_B$ and the A.C. component impressed on the bias level is represented by the input terminal $V_i$.

In accordance with the method of the present invention, both the driver D and the load L are operated in the saturation region so that both devices have square law operating characteristics. As a result, the square law characteristics of the load offset the square law characteristics of the driver and the gain of the amplifier device 10 remains constant over a sgnificant input voltage swing and over a significant temperature range.

Figure 2:
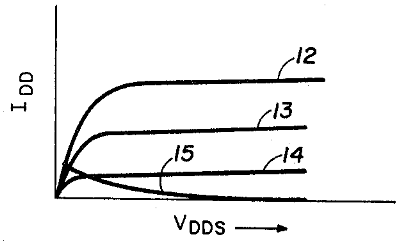
FIGURE 2 is a plot of drain current with respect to drain voltage of the device of FIGURE 1 which serves to illustrate the method of the present invention.

Referring now to FIGURE 2, curves 12, 13 and 14 represent the drain current $I_{DD}$ of the driver transistor D at various gate voltages as expressed by the following equation:

$$I_{DD}=\frac{\beta_D}{2}(V_{GSD}-V_{PD})^2 \quad (1)$$

wherein:

$I_{DD}$=drain current of driver transistor D,
$V_{GSD}$=voltage from gate to source of driver D,
$V_{PD}$=pinch-off voltage of driver D, and
$\beta_D$ is a gain term which for the MOS driver transistor is equal to $W\epsilon\mu/Lt$;

W=width of channel of driver D,
L=length of channel of driver D,
$\epsilon$=dielectric constant of gate insulation,
$\mu$=carrier mobility, and
$t$=thickness of oxide.

The load line of the load transistor L is represented in FIGURE 2 by curve 15 which is defined by the following equation:

$$I_L=\frac{\beta_L}{2}[V_R-V_{DSD}-V_{PL}]^2 \quad (2)$$

wherein:

$\beta_L$=the gain term for the load transistor L,
$I_L$=the current through load L,
$V_R$=reference voltage applied to gate of load,
$V_{DSD}$=drain to source voltage of driver D, and
$V_{PL}$=pinch-off voltage of load L.

It will be noted that the output $v_O$ is equal to $V_{DSL}$, the voltage from drain to source of the load L, and the input voltage $v_I$ is equal to the voltage $V_{GSD}$ from gate to source of the driver D. Since the load current and the driver current are the same, Equations 1 and 2 can be equated and solved for the output voltage $v_O$ as a function of the input $v_I$. This yields:

$$\frac{v_O}{(V_R-V_{PL})}=-\sqrt{\frac{\beta_D}{\beta_L}}\left[\frac{v_I-V_{PD}}{V_R-V_{PL}}\right]+1 \quad (3)$$

It will be recognized that this equation defines a straight line having a negative slope so long as the absolute value of the drain voltage of each transistor is greater than or equal to the absolute value of the difference between the gate voltage and the pinch-off voltage of the respective transistor. The slop of the line is determined by the value of the quantity $(\beta_D/\beta_L)^{1/2}$. Equation 3 is a normalized equation applicable to all field effect transistors and plotted as the straight portions of curves 16–19 in FIGURE 3 for $(\beta_D/\beta_L)^{1/2}$ values of 1, 2, 4 and 8, respectively.

It will also be noted that for MOS transistors the slope or gain term can be written as follows:

$$\left(\frac{\beta_D}{\beta_L}\right)^{1/2}=\left[\frac{\left(\frac{W\epsilon\mu}{Lt}\right)_D}{\left(\frac{W\epsilon\mu}{Lt}\right)_L}\right]^{1/2}=\left[\frac{\left(\frac{W}{L}\right)_D}{\left(\frac{W}{L}\right)_L}\right]^{1/2} \quad (4)$$

if the two transistors D and L have the same gate oxide so that $\epsilon$ and $t$ are the same and the same material forming the gate channel so that the $\mu$ values are the same. Then the ratio expressed in Equation 4 will remain substantially constant over a wide temperature range.

Figure 3:
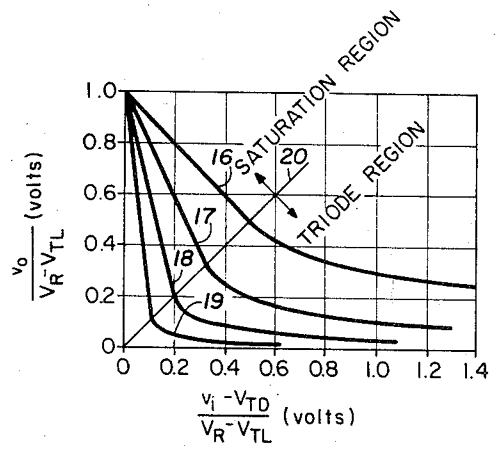
FIGURE 3 is a plot of output voltage with respect to input voltage of the device of FIGURE 1 which serves to illustrate the method of the present invention.

When each of the curves 16–19 passes line 20 in FIGURE 3, the driver transistor D passes from the saturation region to the triode region while the load transistor L remains in the saturation region. As a result, the square law characteristics of the load transistor are no longer compensated by the driver transistor and the curves are no longer straight lines. Line 20 is a straight line with a slope of one which extends from the origin of the normalized plot of FIGURE 3.

The amplifier 10 illustrated in FIGURE 1, the Equations 1–4, and FIGURES 2 and 3 are applicable generally to any field effect transistor device including either junction or MOS type devices with either p-channels or n-channels formed by either the enhancement or depletion mode. Present technology tends to limit practical field effect transistors to depletion mode junction devices, either n-channel or p-channel, p-channel MOS enhancement mode devices, and n-channel MOS depletion mode devices. In each case, however, the polarities of the voltages applied to the particular device would be selected so as to operate the device in the saturation region.

Figure 4:
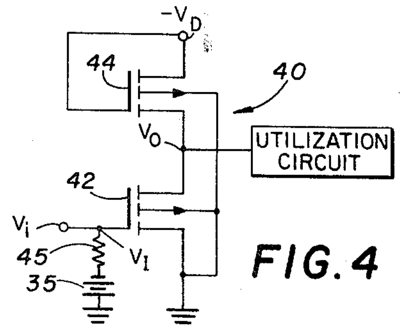
FIGURE 4 is a schematic circuit diagram similar to FIGURE 1 of an amplifier fabricated in accordance with the present invention using enhancement mode MOS transistor devices.

The present invention is particularly suitable for fabrication on a single substrate using MOS transistors. Such a circuit is indicated generally by the reference numeral 40 in FIGURE 4. The amplifier 40 is comprised of a driver MOS transistor 42 and a load MOS transistor 44. The gate of the driver transistor 42 is the input for the amplifier and is biased to some D.C. bias level, as represented by the battery resistance 45, upon which is impressed an A.C. input voltage $V_i$ to produce the input voltage $V_I$. The drain of the driver transistor 42 and the source of the load resistor 44, which are common, form the output voltage $v_O$ which is connected to a utilization circuit. The source of the driver transistor 42 is connected to ground. The drain of the load transistor 44 is connected to a negative drain voltage $V_{DD}$ which also serves as the reference voltage for the gate of the load transistor 44 since it is of the appropriate polarity. It will be noted that the substrates of the two transistors are common and are electrically connected to the source of the driver transistor 42.

Figure 6:
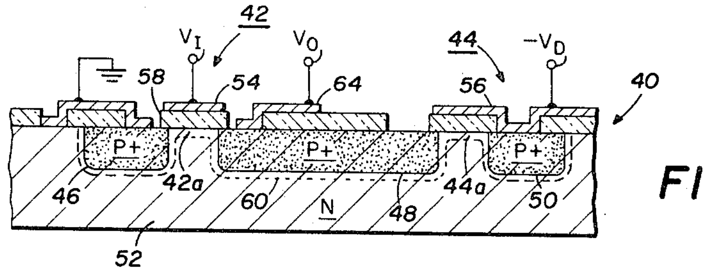
FIGURE 6 is a sectional view taken substantially on lines 6—6 of FIGURE 5.
Figure 5:
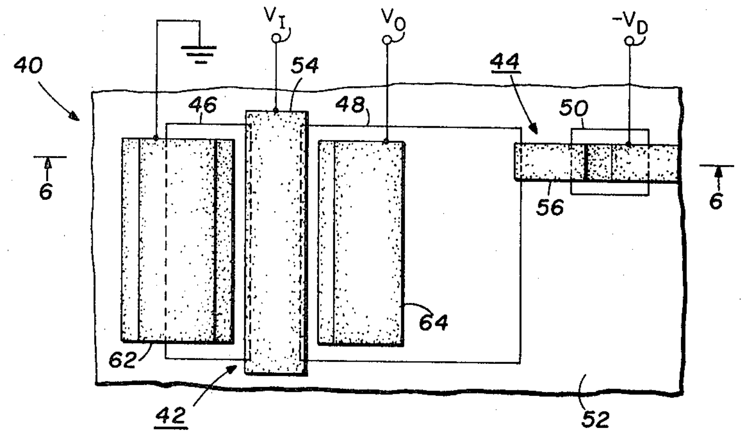
FIGURE 5 is a plan view of an MOS amplifier constructed in accordance with the present invention.

A typical embodiment of the amplifier 40 is illustrated somewhat schematically in FIGURES 5 and 6. This is achieved by three heavily doped p-type diffused regions 46, 48 and 50 formed in an n-type substrate 52. The plan view of the diffused regions 46, 48 and 50 is illustrated in FIGURE 5. Gate electrodes 54 and 56 bridge between the diffused regions 46 and 48 and between diffused regions 48 and 50, respectively, and are electrically insulated from the substrate by the insulating layers 58 and 60, respectively, which are of the same material and thickness. The extent of gates 54 and 56 will be noted from the plan view of FIGURE 5 wherein it is evident that the width of gate 54 is several times the width of gate 56, while the lengths of the channels are equal. When the device is properly biased, the potential on the gate electrodes 54 and 56 produces p-type enhanced channels **42*a* and 44*a*, respectively, at the surface of the n-type substrate which extend between the p-type diffused regions 46 and 48, and between diffused regions 48 and 50, respectively. Channel 42*a* is the channel of the driver transistor 42 and channel 44*a* is the channel of the load transistor 44. Diffused region 46 is the source terminal of transistor 42 and a metallized contact 62 extends through the oxide layer into contact with the diffused region 46 and also extends into contact with the n-type substrate 52. The diffused region 48 is the common drain and source regions of transistors 42 and 44, respectively, and a metallized contact 64 forms the output terminal $v_O$ for the amplifier device. Diffused region 50 is the drain of transistor 44 and the control gate 56 may conveniently extend into contact with diffused region 50 and also form the expanded contact for the drain voltage supply. The amplifier 40** may be fabricated using any suitable conventional technique presently used for fabricating MOS transistors.

The operation of the amplifier 40 conforms to the operation of the amplifier 10 previously described in Equations 1–4 and the graphs of FIGURES 2 and 3. Due to the fact that the width of the channel of the driver transistor 42 is more than four times the width of the channel of the load transistor 44, while the lengths of the channels are equal, the amplifier 40 has a gain of about two. Since the substrate 52 forms a common back gate for both channels **42*a* and 44*a* and is connected to ground, the amplifier 40** does not come as close to achieving the ideal linearity and temperature stability when using discrete field effect transistors so that the back gate of the load transistor L can be connected back to the source of the load transistor as illustrated in FIGURE 1.

In the standard MOS transistor the length of the channel is usually made as short as possible with the available technology. This is typically about 0.0002 inch. In such a case, the effective length of the channel of the driver transistor is decreased as the drain voltage of the transistor goes negative. This is due to the fact that the negative voltage (i.e., the output voltage) on diffused region 48, for example, induces a depletion region represented by the dotted outline 60 in FIGURE 6 around the diffused region which shortens the effective length of channel **42*a*. The channel may be shortened as much as 25% for a standard channel length of 0.0002 inch. As a result, the characteristics of the transistor do not precisely follow the ideal square law necessary in order to achieve a linear output in the amplifier of this invention. For this reason, it is desirable to make the length of the driver channel 42*a* substantially longer so that the adverse effect resulting from shortening of the length of the channel would be reduced. For example, if the length of the channel is increased to 0.0006 inch, the channel would only be shortened 8.5% and the nonlinearity resulting from this factor will be reduced significantly. This is also true with respect to the load channel 44*a***.

Although preferred embodiments of the invention have been described in detail, it is to be understood that various changes, substitutions, and alterations can be made therein without departing from the spirit and scope of the invention as defined by the appended claims.

What is claimed is:

1. A linear A.C. amplifier comprising a first field effect transistor constituting a driver and the second field effect transistor constituting a load, each of said transistors having a source, a drain and a control gate, and each having essentially identical non-linear operating characteristics, means for applying biasing voltage to the control gates of the first and second transistors for operation in the saturation region, input signal means for applying A.C. voltage to the control gate of said first transistor, the drain of said first transistor being electrically connected to an output utilization means, and the source of said second transistor being electrically common with the drain of the first transistor and the utilization means whereby the nonlinear operating characteristics of the individual transistors are cancelling and a linear transfer characteristic obtained.

2. A linear A.C. amplifier, as defined in claim 1, wherein the first and second field effect transistors are formed on the same semiconductor crystal.

3. An A.C. amplifier, as defined in claim 1, wherein the first and second field effect transistors are metal-oxide-semiconductor type devices and are formed on the same semiconductor crystal.

4. An A.C. amplifier, as defined in claim 1, wherein the first and second field effect transistors are enhancement mode, p-channel, metal-oxide-semiconductor devices, formed on the same semiconductor crystal, and the gate and drain of the second field effect transistor are electrically common.

5. A linear inverter A.C. amplifier comprising a first field effect transistor having a source, a drain and a control gate, said first field effect transistor constituting a driver; a second field effect transistor having a source, a drain and a control gate, said second field effect transistor having its source common with the drain of said first field effect transistor and thereby constituting a load; said first and second field effect transistors being of similar materials and thereby having substantially the same square law operating characteristics, D.C. voltage supply means connected to the source of the first field effect transistor, the drain of the second field effect transistor, the gate of the second field effect transistor, and the gate of the first field effect transistor for biasing both the first and second field effect transistors for operation in the saturation region, and input signal means for applying an A.C. voltage to the gate of said first transistor, whereby a relatively undistorted inverted output signal will be transferred to output means connected to the drain of the first transistor.

6. A linear inverter A.C. amplifier, as defined in claim 5, wherein the first and second field effect transistors are on the same semiconductor crystal.

7. A linear inverter A.C. amplifier, as defined in claim 6, wherein the first and second field effect transistors are enhancement mode, p-channel, metal-oxide, semiconductor transistors and the drain and gate of the second field effect transistor are common.

8. A linear inverter A.C. amplifier, as defined in claim 7, wherein the channels of the transistors are substantially greater in length than .0002 inches and of the order of .0006 inches, whereby the depletion region therein under ordinary operating conditions will be substantially less than twenty-five percent thereof.

References Cited

UNITED STATES PATENTS

| | | | |
|---|---|---|---|
| 3,278,853 | 10/1966 | Lin | 330—24 |
| 3,210,677 | 10/1965 | Lin | 330—17 |

JOHN W. HUCKERT, *Primary Examiner.*

M. EDLOW, *Assistant Examiner.*

U.S. Cl. X.R.

307—304; 317—234; 330—39